(12) United States Patent
Pueschner et al.

(10) Patent No.: US 10,157,848 B2
(45) Date of Patent: Dec. 18, 2018

(54) CHIP CARD MODULE ARRANGEMENT, CHIP CARD ARRANGEMENT AND METHOD FOR PRODUCING A CHIP CARD ARRANGEMENT

(71) Applicant: Infineon Technologies AG, Neubiberg (DE)

(72) Inventors: Frank Pueschner, Kelheim (DE); Jens Pohl, Bernhardswald (DE); Thomas Spoettl, Mintraching (DE); Peter Stampka, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/882,524

(22) Filed: Oct. 14, 2015

(65) Prior Publication Data

US 2016/0141248 A1  May 19, 2016

(30) Foreign Application Priority Data

Oct. 14, 2014 (DE) .......... 10 2014 015 158
Dec. 11, 2014 (DE) .......... 10 2014 018 393

(51) Int. Cl.

| | |
|---|---|
| *H01L 23/495* | (2006.01) |
| *H01L 23/538* | (2006.01) |
| *H01L 21/56* | (2006.01) |
| *H01L 23/31* | (2006.01) |
| *H01L 23/66* | (2006.01) |
| *G06K 19/07* | (2006.01) |
| *G06K 19/077* | (2006.01) |

(52) U.S. Cl.
CPC ........ *H01L 23/5388* (2013.01); *G06K 19/072* (2013.01); *G06K 19/07747* (2013.01); *G06K 19/07754* (2013.01); *G06K 19/07784* (2013.01); *H01L 21/56* (2013.01); *H01L 23/3142* (2013.01); *H01L 23/66* (2013.01); *H01L 2223/6677* (2013.01); *H01L 2224/16225* (2013.01); *H01L 2224/32225* (2013.01); *H01L 2224/73204* (2013.01); *H01L 2924/181* (2013.01)

(58) Field of Classification Search
CPC .. H01L 23/5388; H01L 23/3142; H01L 23/66
USPC ........................................ 257/679
See application file for complete search history.

(56) References Cited

U.S. PATENT DOCUMENTS

2005/0146006 A1* 7/2005 Yamazaki ........ G06K 19/07749
257/679
2007/0176622 A1* 8/2007 Yamazaki .......... G06K 19/0728
257/679
2008/0023810 A1* 1/2008 Yamazaki ........ G06K 19/07728
257/679

(Continued)

FOREIGN PATENT DOCUMENTS

CN       1914735 A    2/2007

*Primary Examiner* — Nitin Parekh
(74) *Attorney, Agent, or Firm* — Viering, Jentschura & Partner MBB

(57) ABSTRACT

A chip card module arrangement may include a first surface and a second surface, which are opposite from one another, and a chip receptacle for one or more semiconductor chips on the surfaces. The chip card module arrangement may further include a connecting material receiving area on one of the two surfaces, the connecting material receiving area only taking up a portion of the surface.

18 Claims, 4 Drawing Sheets

(56) References Cited

U.S. PATENT DOCUMENTS

| | | | |
|---|---|---|---|
| 2009/0200650 A1* | 8/2009 | Tan | G06K 19/072 |
| | | | 257/679 |
| 2009/0283602 A1* | 11/2009 | Rogy | G06K 19/07749 |
| | | | 235/492 |
| 2009/0283886 A1* | 11/2009 | Yamazaki | G06K 19/0704 |
| | | | 257/679 |
| 2010/0059748 A1* | 3/2010 | Yamazaki | G06K 19/07749 |
| | | | 257/49 |
| 2010/0127084 A1* | 5/2010 | Pavate | G06K 19/07749 |
| | | | 235/492 |
| 2014/0263663 A1 | 9/2014 | Pueschner et al. | |
| 2016/0060490 A1* | 3/2016 | Uchida | C09D 133/068 |
| | | | 428/414 |

* cited by examiner

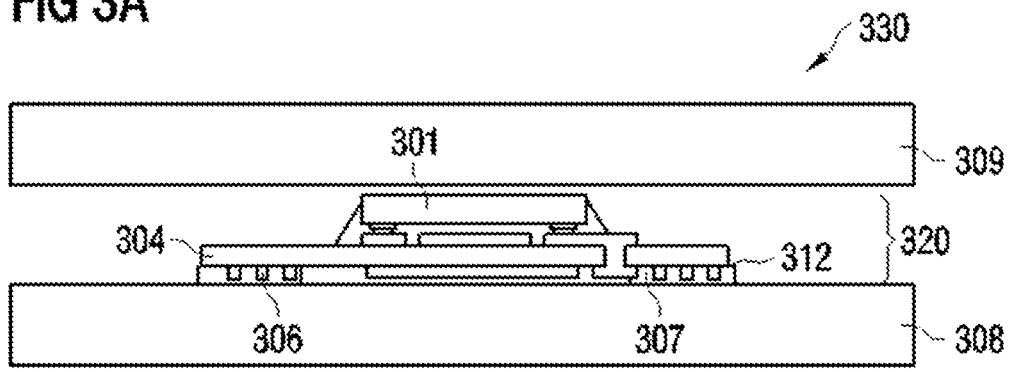
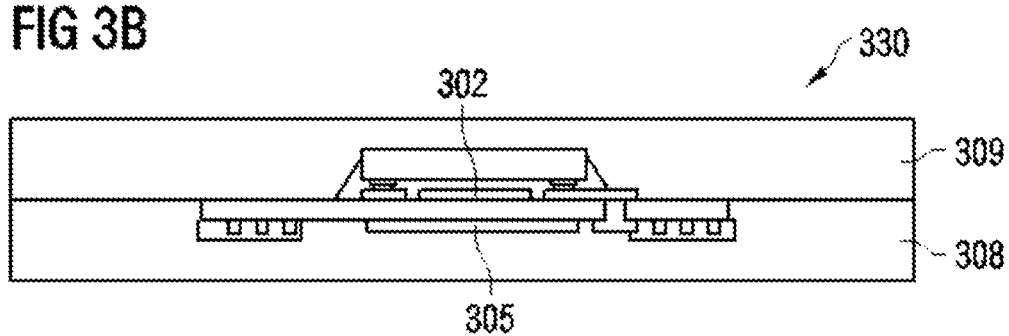

CHIP CARD MODULE ARRANGEMENT, CHIP CARD ARRANGEMENT AND METHOD FOR PRODUCING A CHIP CARD ARRANGEMENT

CROSS-REFERENCE TO RELATED APPLICATION

This application claims priority to German Patent Application Serial No. 10 2014 015 158.1, which was filed Oct. 14, 2014, and is incorporated herein by reference in its entirety. This application further claims priority to German Patent Application Serial No. 10 2014 018 393.9, which was filed Dec. 11, 2014, and is incorporated herein by reference in its entirety.

TECHNICAL FIELD

Various embodiments relate generally to chip cards and to partial aspects of their structure and their production.

BACKGROUND

Chip cards (smart cards or else integrated circuit cards) are used in many different application areas. For example in personal identification (identity cards, access cards, authorization cards), in data encryption (code cards), for personal use (bank chip cards, payment cards) and similar areas. Apart from costs, aspects involved in the design of chip cards and their production may also be durability or robustness, immunity to falsification and manipulation and also the desired functionality.

Chip cards usually consist of carrier layers, in which one or more semiconductor chips, the electronic "heart" of the chip card, are arranged.

One aspect of chip cards is their durability in practical use with respect to stresses caused by the environment and by people, that is to say for example the card owner. These include, for example, temperature fluctuations, chemical influences and mechanical deformation that occur during production and during the use or storage of the cards. Thermal stressing may also result in mechanical deformation, since temperature fluctuations cause material expansion or shrinkage, and this in turn can for example bend regions of the chip card.

The conventional structure of the chip card arrangement or the chip card module arrangement may adversely influence the mechanical stability, and consequently reduce the robustness of the chip card with respect to stresses.

SUMMARY

A chip card module arrangement may include a first surface and a second surface, which are opposite from one another, and a chip receptacle for one or more semiconductor chips on the surfaces. The chip card module arrangement may further include a connecting material receiving area on one of the two surfaces, the connecting material receiving area only taking up a portion of the surface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3 A and B show an example of a chip card module arrangement according to various embodiments before (FIG. 3A at the top) and after (FIG. 3B at the bottom) running through a production process for a chip card arrangement;

DESCRIPTION

Figure 1:
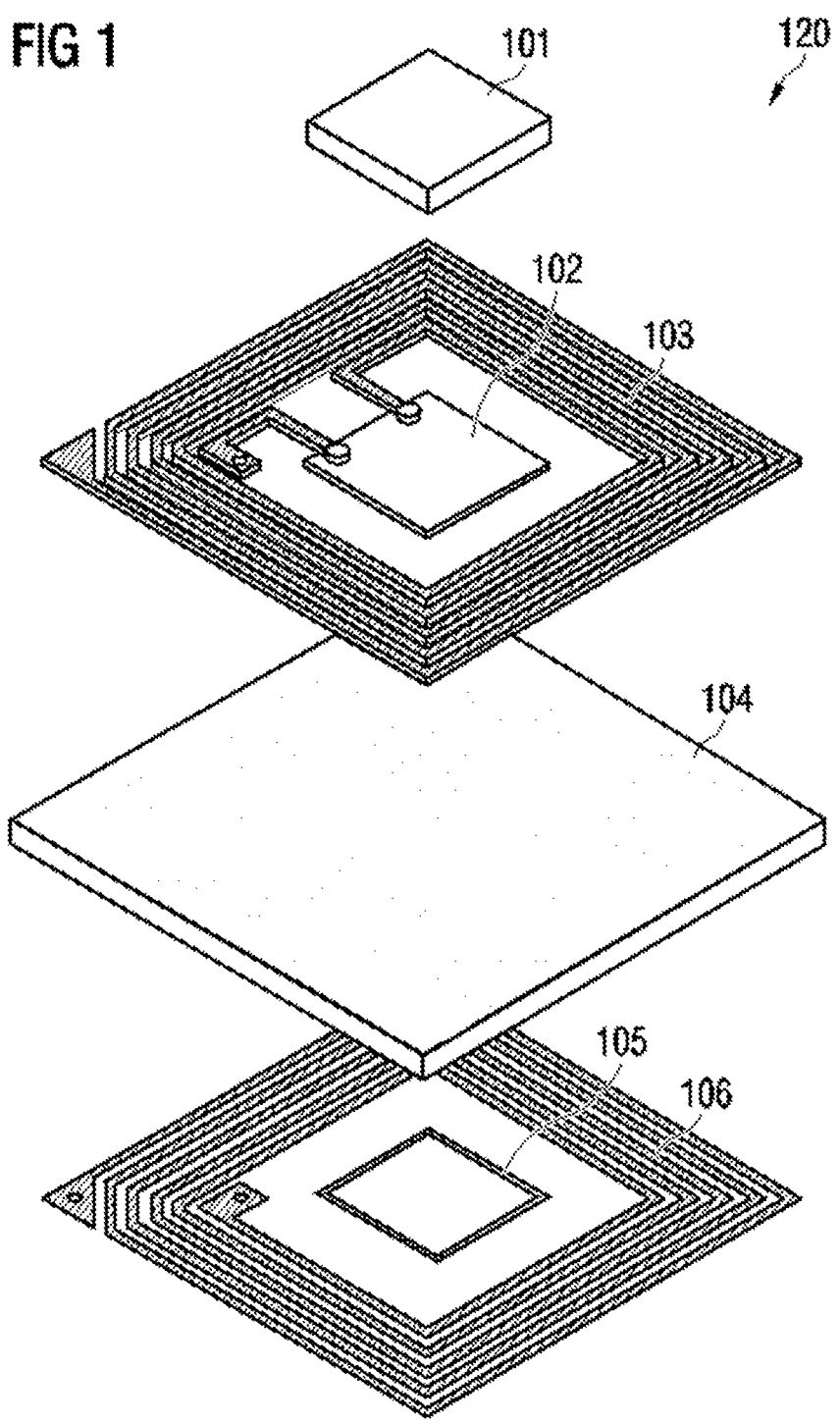
FIG. 1 shows an example of a chip card module arrangement with an antenna arrangement in a schematic exploded representation.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may improve the structure, production and robustness.

Chip cards usually include carrier layers, which may be made of a plastics material, in connection with what is known as a chip package, in which one or more semiconductor chips are located. The carrier layers often have the form of sheets or films and may also be referred to as webs. Usually two thicker carrier layers are connected to form a chip card and therein form the upper side and the underside. The already mentioned chip package contains one or more semiconductor chips, also referred to as integrated circuits (ICs), the electronic "heart" of the chip card. This can be compared in its function for example with the processor of a personal computer. There are chip cards of a wide variety of dimensions and sizes, in order for them to be adapted to the respective application areas. The size most frequently used is that of the check card ("EC card"), which has been standardized as the "ID1" format.

Chip packages, or else chip card modules, have various embodiments and are also referred to as a chip card module arrangement. Their configurations vary according to requirements for robustness, production costs, forms of communication (for example a contact-based or dual-interface chip card) or size, to mention a few criteria here by way of example. The chip card module arrangement serves for receiving and positioning the chips and may provide connections and/or points of contact for contacting the chips with respect to the surroundings, an antenna, an energy supply or external connections.

A chip card with a chip card module arrangement is usually produced by first being embedded between at least two carrier layers. Often, for this purpose the chip card module arrangement is first fixed on one of the two carrier layers. After that, the second carrier layer is positioned in such a way that the chip card module arrangement is located between the carrier layers. The chip card module arrangement may be embedded in the carrier layers (laminated and/or pressed in) in such a way that the carrier layers form the chip card (the "chip card shell" for the chip card module arrangement) or at least partially form a chip card, for example a chip card arrangement. Still further layers, which may serve for example for printing on the chip card and for protecting the surfaces, may be applied to the carrier layers. The aim of a high-quality laminating or pressing process is to create a chip card with a substantially planar surface.

A possible method for producing a chip card arrangement includes:

a) Connecting material is applied to at least one of the two surfaces that are to be connected. The two said surfaces are the connecting material receiving area on one side of a chip card module arrangement and the surface that represents a subarea of a first carrier layer. The connecting material may be applied over the full surface area on said side of the chip card module arrangement. According to various embodiments, it may be advantageous if the connecting material is applied only in certain regions or areas on said side of the chip card module arrangement. In this respect it may be important for example whether, after it has been applied, the connecting material covers the entire side of the chip card module arrangement or only subareas.

b) Attaching a chip card module arrangement on a first carrier layer by said connecting material, the chip card module arrangement including for example the following components: a substrate; one (or more) chip(s) on the substrate; and a connecting material receiving area.

c) A second carrier material is positioned opposite the first carrier layer in such a way that the chip card module arrangement is located between these two carrier layers.

d) Laminating and/or pressing the first carrier layer with the second carrier layer. As a result, the chip card module arrangement is enclosed by the carrier layers. Still further layers can be processed together with said carrier layers.

In an alternative embodiment, the body of the chip card or chip card arrangement to be produced may be made up of more than two layers or carrier layers. This would be the case if, for example, further films are to be attached on the outer side of the chip card arrangement, in order for example to achieve certain effects. These may be for instance decorative functions, the adding of security features, or the anchoring of photos and personal identification features. There are various production variants for this. One possible variant is that of jointly positioning all of the layers to be used and then also jointly pressing or laminating them. In the case of other variants, the films and carrier layers are joined together in a certain sequence and the connecting of these layers takes place in a number of processing steps.

In one possible embodiment, the body of the chip card or chip card arrangement to be produced may contain still further layers of material between the carrier layers. These may serve the purpose of forming a distance between the carrier layers, in order for example that the chip card module arrangement is subjected to less mechanical loading by pressure during the pressing or lamination.

A chip card module arrangement may contain one or more chips, also referred to as integrated circuits (ICs) or semiconductors. The chip or the chips are positioned on the chip receptacle and are electrically connected to the chip card module arrangement. The chips may be electrically connected to one another. The chip or chips are also mechanically attached within the chip card module arrangement. This may be ensured for example by way of electrically conducting or metallic elevations at the contact points (known as "bumps"). As already mentioned, a number of chips may be located in a chip card module arrangement. It is also possible, however, that a number of chip card module arrangements are integrated within a chip card, and consequently likewise a number of chips are located in a card. These cards with a number of chip card module arrangements are often referred to as "hybrid cards".

As already stated, one component part of the chip card module arrangement is a substrate. This may include a plastic (or a polymer) or be made up of plastic (or a polymer). The substrate forms the carrier of the chip card module arrangement. The substrate is often clad with one or more metal layers. These are used for forming electrically conductive tracks for the connection of electrical components (for example integrated circuits—ICs, or passive electrical components such as resistors and capacitors) of the chip card module arrangement or may also be used for forming an antenna arrangement (see the description below).

As described above in the production process given by way of example, in one of the production steps the chip card module arrangement is connected to at least one carrier layer or a carrier material of the card body by means of connecting material. For this purpose, the chip card module arrangement may be provided with a connecting material receiving area. This is intended for the purpose that an adhesive for example is positioned there. The connecting material is usually applied to this connecting material receiving area by means of a tool in the automated production process. This tool may be controlled in such a way that the connecting material is only adsorbed at certain predetermined areas and area portions. This usually allows an exact positioning of the adhesive to be achieved, which may be of interest for the execution of various embodiments. These exact positionings allow a complex form of the connecting material receiving area, which may for example also consist of a number of independent subareas and may include the widest variety of geometrical forms. The connecting material receiving area may be located on the same side of the chip card module arrangement as the chips or the chip of the chip card. It is also possible that the connecting material receiving area is on the side that is opposite from the side on which the chip or the chips are located.

The connecting material receiving area may be visibly delimited on said side of the chip card module arrangement. However, the connecting material receiving area does not have to be visible; all that matters is on which parts of the surface of the side of the chip card module arrangements the connecting material is located after it has been applied. The tool that is used in the production step of applying the connecting material may distribute it in such a way that, depending on the design of the chip card module arrangements, it covers said side of the chip card module arrangements either partially or over the full surface area.

A large number of substances are suitable as connecting material. Those most frequently used are commercially available adhesives with a wide variety of qualities and properties. The application and bonding of the connecting material may be influenced by the nature of the surface of the connecting material receiving area. It may therefore be advantageous in the conceptual design of the chip card to adapt the connecting material receiving area and its properties to those of the adhesive to be used.

Various embodiments of the chip card module arrangement may include an antenna arrangement. This antenna arrangement may be configured as windings, of an electrically conducting material, on one or both sides of the chip card module arrangement. The antenna arrangement is usually electrically connected within the chip card module arrangement to the chip or the chips. The antenna arrangement is also mechanically connected to the chip card module arrangement. This may be ensured for example by the antenna arrangement being formed from one of the layers of the layered structure of said substrate (for example by way of an etching operation in which the metallic outer layers of the substrate are altered in such a way that an antenna winding is created). As an alternative to this, the antenna arrangement (in this case formed as a film, possibly including a number of layers) may also be attached on the surfaces of the substrate by a connecting material.

In various embodiments, the chip card module arrangement may also have contact areas for what is known as contact-based operation, according for example to ISO 7816. These contact areas are in this case configured in such a way, or the chip card module arrangement is incorporated in the card body in such a way, that the contact areas come to lie on the surface of the chip card, and consequently can be externally contacted, by for example a chip card reader suitable for this.

Chip cards must be robust with respect to the stresses from production and use. Mechanical loads, which are caused for example by the handling of the card by the user, play a great part in this respect. The following for example may be understood herein as a mechanical load: a mechanical pressure, a mechanical stress, a torsional stress, a flexural stress, a deformation, an extension under strain, a bending, a tensile stress, a compressive stress, an elastic deformation, a punctiform load or force, and the like. Such mechanical loading may occur both during use of the chip card in which the chip card module arrangement is integrated and during production of the chip card itself, that is to say for example during the embedding (integration) of the chip card module arrangement in the layers of the future card. For example, mechanical loads may occur during the lamination and/or pressing of a chip card module arrangement between carrier layers of the card. Chips could be damaged by these loads.

In some embodiments, the chip card module arrangement may also include stabilizing elements for mechanical strengthening. These serve the purpose of reinforcing the elements of the chip card module arrangement during the mechanical deformation of the chip card, and consequently reducing the probability of for example a breakage of the chips or of the substrate. The stabilizing elements are often provided in the middle of the chip card module arrangement and may include metallic layers, which may be connected to the substrate. They are often configured over the surface area and may come to lie on a carrier layer or carrier layers in the production process of the chip card.

In embodiments of the chip card, a partial aspect of various embodiments is to position the mechanical stabilizing elements within the chip card and its carrier layers in such a way that great mechanical stability is achieved and for example chip breakage during bending is reduced. An aim is that the mechanical stabilizing elements come to lie directly on the carrier layers in the finished chip card produced. This can be achieved by positioning the connecting material, since, with the conventional designs and production methods, it can at least partially lie between the mechanical stabilizing elements and the carrier material. It may be advantageous that connecting material is only positioned where the mechanical stability of the card is not reduced and the associated connecting material receiving area is correspondingly dimensioned or designed in its form. In other words, it may be advantageous that certain locations remain free from the connecting material. These are therefore particularly those areas where the stabilizing elements are located. Consequently, the positioning and extent of the connecting material receiving area may be of interest.

In the conventional structure of the chip card module arrangement there is no consideration as to whether connecting material is applied to the area that is formed by the chip or chips, that is to say the chip receptacle. The same applies to the case where the connecting material receiving area is located on the same side of the chip card module arrangement as the chip or chips. That is to say that in conventional designs of the chip card module arrangement the connecting material receiving area may overlap with the chip receptacle. It may be advantageous for various embodiments that the connecting material is not positioned or applied at those locations that overlap with the area of the chip receptacle. This means that the area that the connecting material covers is disjoint from that of the chip receptacle.

An equivalent situation applies in the case where the connecting material receiving area is located on the side opposite from the chip(s). In this variant there is no consideration in the conventional structure of the chip card module arrangement as to whether connecting material is applied to the area that is directly opposite from the chips or the chip, that is to say the projected chip receptacle. It may be advantageous for various embodiments that the connecting material is not positioned or applied at those locations that overlap with the area of the projected chip receptacle.

In possible embodiments of the chip card arrangement, the chips may also be attached on both sides of the chip card module arrangement. There is consequently not just a chip receptacle on one side of the chip card module arrangement but instead two chip receptacles on the opposite sides. In this case, the requirement for the positioning according to various embodiments of the connecting material is that it is only to be applied to those areas that do not have any subareas with the chip receptacles or the area of the chip receptacle that is projected onto the connecting material receiving area. That is to say that the unified areas of the chip receptacles, or areas of the chip receptacles that are projected as unified, are to be disjoint from the connecting material receiving area.

In possible embodiments of the chip card arrangement, there may be a number of chips and a number of stabilizing elements. Here it may be provided for the positioning according to various embodiments of the connecting material that it is applied only to those subareas that do not have any subareas with stabilizing elements and chip receptacles. In the case of chips or stabilizing elements that are positioned on the opposite side of the connecting material receiving area, the connecting material receiving area according to various embodiments may be configured in such a way that it does not have any subarea in common with the projections lying on its side of those areas of the opposite chips or stabilizing elements.

In all of the embodiments described, the connecting material receiving area may be made smaller than the area that is disjoint from chip receptacles or stabilizing elements.

The positioning according to various embodiments of the connecting material and the dimensioning of the associated connecting material receiving area may produce the advantage that the mechanical stability of the chip card module arrangement or chip card arrangement is increased, and consequently there is a reduced probability of failure during the production or in the field during practical use. For example, the frequency of a chip breakage under flexural stress is reduced.

In one embodiment there may be provided a chip card module arrangement in which the chip receptacle and also the connecting material receiving area lie on the same one of the two surfaces and the connecting material receiving area only takes up the area that is disjoint from the area of the chip receptacle.

In one embodiment there may be provided a chip card module arrangement in which the chip receptacle lies on the first surface and the connecting material receiving area is located on the second surface and the connecting material receiving area only takes up the area that is disjoint from the area of the chip receptacle in the projection onto the first surface.

In one embodiment there may be provided a chip card module arrangement in which the connecting material receiving area is located on one of the two surfaces and is configured as a contiguous area or as equally distributed areas within the surface.

In one embodiment there may be provided a chip card module arrangement in which an antenna arrangement is located on the chip card module arrangement.

In one embodiment there may be provided a chip card module arrangement in which parts of the antenna arrangement are located on the connecting material receiving area.

In one embodiment there may be provided a chip card module arrangement in which a stabilizing element is located on the first surface and the chip receptacle lies on the second surface.

In one embodiment there may be provided a chip card module arrangement in which the area of the stabilizing element on the first surface is disjoint from that of the connecting material receiving area on the first surface.

In one embodiment there may be provided a chip card module arrangement in which the area of the stabilizing element on the first surface and the connecting material receiving area on the second surface are disjoint in the projection onto the first surface.

In one embodiment there may be provided a chip card module arrangement in which an adhesive has been applied to the connecting material receiving area as connecting material.

A method for connecting a chip card module arrangement to a first carrier layer may also additionally include the positioning of the chip card module arrangement between the first carrier layer and a second carrier layer.

A method for connecting a chip card module arrangement to a first carrier layer may also additionally include pressing together at least the first carrier layer and the second carrier layer.

In one embodiment there may be provided a chip card arrangement in which a second carrier layer is present in addition to the first carrier layer.

In one embodiment there may be provided a chip card arrangement in which the one carrier layer or the number of carrier layers is or are the web or the webs of a chip card.

In one embodiment there may be provided a chip card arrangement in which the carrier layer or the carrier layers contain(s) plastics material.

In one embodiment there may be provided a chip card arrangement in which the connecting material is an adhesive.

In one embodiment there may be provided a chip card arrangement in which at least one region of the chip card module arrangement is free from connecting material.

FIG. 1 shows an example of a chip card module arrangement 120 in an exploded representation. The chip card module arrangement includes a chip 101, stabilizing elements 102 and 105, antenna windings 103 and 106 and a substrate 104.

More simple embodiments of chip card module arrangements only include the chip 101 and the substrate 104 as well as connection structures (not shown in FIG. 1) in the layers 103 and/or 106 for connecting the chip to contacts, which make an electrical connection, for example to readers. Other embodiments additionally have metallic contact areas (not shown in FIG. 1), which allow a reader to establish an electrical connection with the chip. Other variants in turn have a number of chips, which are incorporated in a chip card module arrangement.

As a departure from the example of FIG. 1, other embodiments have only one of the two antenna windings 103 and 106 shown, or no antenna at all.

The chip 101 may be electrically and also mechanically connected to the substrate 104 by way of various methods. Usually, the mechanical attachment is performed by a connecting material (for example an adhesive). The electrical contacting takes place by what are known as "wire bonds" or else by "flip-chip" technology with what are known as "bumps".

Figure 2:
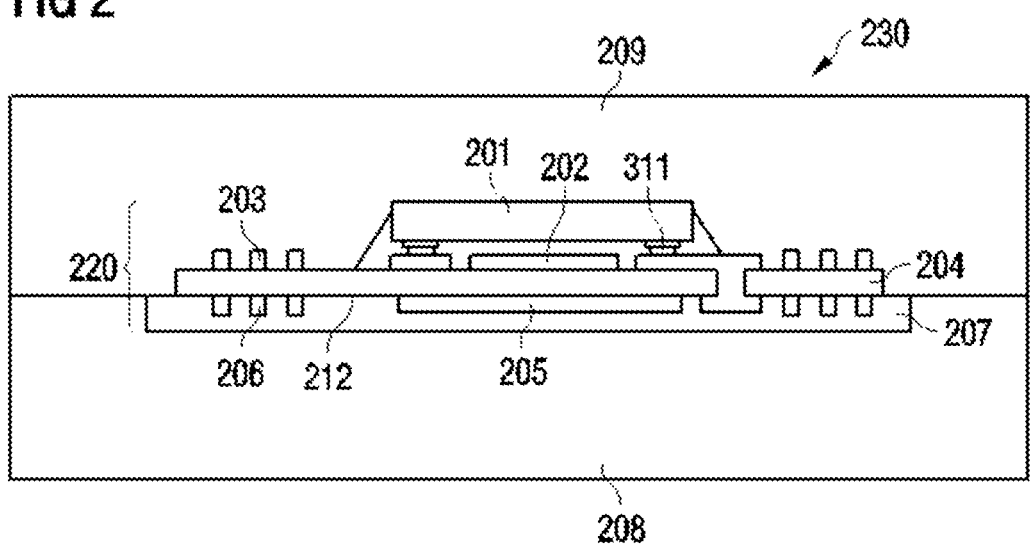
FIG. 2 shows an example of a conventional chip card arrangement with a chip card module arrangement within layers of material and carrier layers of a chip card and a connecting material.

FIG. 2 shows an example of a chip card arrangement 230 with chip card carrier layers 208 and 209 of a chip card and a cross section of a chip card module arrangement 220 that has the following elements: a chip 201, stabilizing elements 202 and 205, antenna windings 203 and 206, a substrate 204, a connecting material 207, a connecting material receiving area 212 and a bump 211. As already described, not all of the elements have to be present in the various embodiments. Thus, for example, one or both antenna windings 203 and 206 may be omitted or, by analogy, the stabilizing elements 202 and 205 may be omitted.

The carrier layers 208 and 209 may consist of plastics material or may include plastics material. Plastics that are frequently used for this are PVC and PC, that is to say polyvinylchloride and polycarbonate.

The stabilizing elements 202 and 205 serve the purpose of mechanically attaching the chip card module arrangement, and consequently increasing its robustness. In the chip card arrangement, stabilizing elements may lie directly on a carrier layer. The stabilizing elements have in particular the task of reducing the probability of a breakage of the semiconductor chip 201 in the chip card module arrangement 220, should the card be mechanically deformed (for example bending).

In various embodiments of a chip card arrangement, the connecting material 207 may be an adhesive. The connecting material receiving area 212 defines the region of the chip card module arrangement 220 where the connecting material is positioned.

Bumps 211 are an example of how a chip 201 can be electrically and mechanically connected to the substrate 204. They are often used in the case of the flip-chip technology mentioned.

FIGS. 3 A and B show an example of a cross section of a chip card arrangement 330 with a chip card module arrangement 320 before (FIG. 3A at the top) and after (FIG. 3B at the bottom) the incorporation between the chip card carrier layers 308 and 309 of a chip card.

In this embodiment, the chip card module arrangement 320 includes: stabilizing elements 302 and 305, chip 301, substrate 304, antenna windings 306, a connecting material 307, a connecting material receiving area 312.

According to various embodiments, the connecting material receiving area 312 does not include the entire surface area of a side of the chip card module arrangement 320. This will be the case for example in FIG. 2, where the connecting material receiving area 212 extends over the entire side of the chip card module arrangement 220. In FIGS. 3 A and B, the connecting material receiving area 312 covers only that area where there is no chip 301 on the other side of the chip card module arrangement 310, that is to say no chip receptacle covers the side. Consequently, when it is projected onto the side of the chip receptacle, the connecting material receiving area 312 is disjoint from this chip receptacle, that is to say the projected connecting material receiving area 312 has no area in common with the chip receptacle. Also, the connecting material receiving area 312 does not cover the area of the stabilizing element 305.

Figure 4:
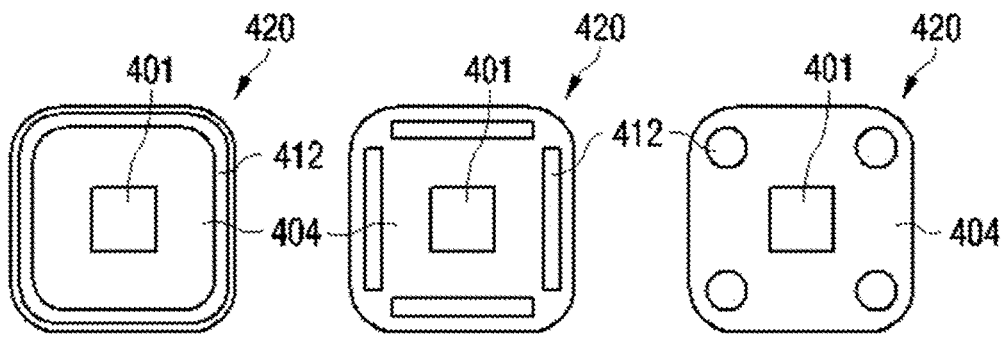
FIG. 4 shows examples of the form and position according to various embodiments of the connecting material receiving area on a chip card module arrangement.

FIG. 4 shows three examples of the possible outline of a chip card module arrangement 420. In these embodiments, the chip card module arrangement 420 includes: chip 401, which is equal in area to the chip receptacle 401, substrate 404 and a connecting material receiving area 412.

According to various embodiments, the connecting material receiving area 412 does not include the entire base area of the chip card module arrangement but only subareas that do not have any areas in common with the area of the chip or the chip receptacle 401 represented, that is to say are disjoint from the chip area. Many other forms of the connecting material receiving area that satisfy this condition are conceivable.

The three forms that are shown in FIG. 4 only represent illustrative examples. Various embodiments of the connecting material receiving area are symmetrical with respect to the principal axes of the base area of the chip card module arrangement, in order to ensure a connection in all directions where mechanical forces can occur. As in embodiments of FIG. 4 that are shown, the connecting material receiving area may be a strip at the periphery of the base area of the chip card module arrangement. This has the effect of increasing the certainty that no connecting material goes over—even only partially—to that area that is covered by the chip.

If stabilizing elements (not shown in FIG. 4) have been incorporated in the chip card module arrangement, it may then have the effect for various embodiments that the connecting material receiving area does not have any subarea in common with the stabilizing elements. This also applies to the case where stabilizing elements are located on the opposite side of the connecting material receiving area. Then, in turn, the projection of the connecting material receiving area onto the side of the chip card module arrangement where the stabilizing elements are located should be disjoint from the area that these stabilizing elements cover.

Figure 5:
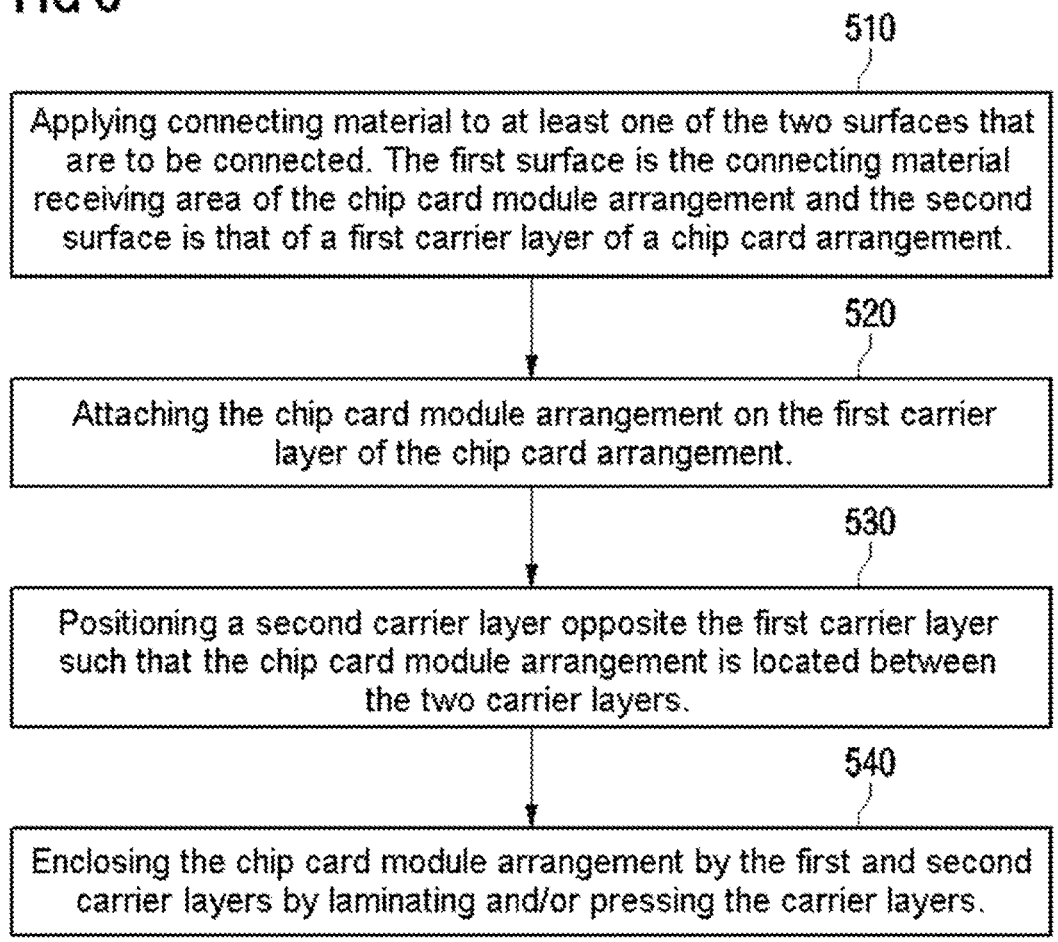
FIG. 5 shows an example of the steps of a method for connecting a chip card module arrangement to carrier layers of the chip card arrangement.

FIG. 5 shows an example of the possible steps 510 to 540 for producing a chip card arrangement.

Various embodiments have been described in this document with reference to the arrangement of a chip card module arrangement in a chip card. However, this arrangement and the described system and method can be used equally well with other packages. Various embodiments may also be used in other application areas. Mention should be made in this respect for example of the attachment of the chip card module arrangement on other carrier materials than those that are used for chip cards. For example, the following carrier materials:

printed circuit boards (PCBs);
textiles, keyword "wearables";
ceramic, such as for instance in the case of power semiconductors;
metals, for rapid heat dissipation.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip card module arrangement, comprising:
a first surface and a second surface, which are opposite from one another;
a chip receptacle for one or more semiconductor chips on the first surface and/or the second surface;
a connecting material receiving area on the first surface and/or the second surface, the connecting material receiving area configured to receive a connecting material and only taking up a portion of the respective surface, wherein the connecting material receiving area is disjoint from the chip receptacle, and wherein the connecting material comprises an adhesive disposed on at least one of the two surfaces where the adhesive is configured to couple to at least one carrier layer; and an antenna arrangement disposed directly on a surface opposite to the chip receptacle and wherein the adhesive is further configured to directly couple the chip card module arrangement to a surface of the at least one carrier layer.

2. The chip card module arrangement of claim 1, wherein the chip receptacle and also the connecting material receiving area lie on the same one of the two surfaces and the connecting material receiving area takes up only the area that is disjoint from an area of the chip receptacle.

3. The chip card module arrangement of claim 1, wherein the chip receptacle is on the first surface and the connecting material receiving area is located on the second surface and the connecting material receiving area only takes up the area that is disjoint from the area of the chip receptacle in the projection onto the first surface.

4. The chip card module arrangement of claim 1, wherein the connecting material receiving area is located on one of the two surfaces and is configured as a continuous area or as equally distributed areas within a surface.

5. The chip card module arrangement of claim 1, wherein parts of the antenna arrangement are located on the connecting material receiving area.

6. The chip card module arrangement of claim 1, wherein a stabilizing element is located on the first surface and the chip receptacle lies on the second surface.

7. The chip card module arrangement of claim 6,
wherein an area of the stabilizing element on the first surface is disjoint from that of the connecting material receiving area on the first surface.
8. The chip card module arrangement of claim 6,
wherein an area of the stabilizing element on the first surface and the connecting material receiving area on the second surface are disjoint in the projection onto the first surface.
9. The chip card module arrangement of claim 1,
wherein an adhesive has been applied to the connecting material receiving area as connecting material.
10. The chip card module arrangement of claim 5,
wherein the chip receptacle is on the first surface and the connecting material directly couples at least a portion of the second surface to the at least one carrier layer.
11. A chip card arrangement, comprising:
at least one carrier layer;
a chip card module arrangement which comprises a first surface and a second surface, which are opposite from one another, and a chip receptacle for one or more semiconductor chips on one of the two surfaces and a connecting material receiving area on one of the two surfaces, wherein the connecting material receiving area is disjoint from the chip receptacle, the connecting material receiving area configured to receive a connecting material and only taking up a portion of the respective surface; and
the connecting material on the connecting material receiving area, and wherein the connecting material comprises an adhesive disposed on the first surface and/or the second surface where the adhesive directly couples the chip card module arrangement to the at least one carrier layer; and an antenna arrangement disposed directly on a surface opposite to the chip receptacle.
12. The chip card arrangement of claim 11,
wherein a second carrier layer is present in addition to the at least one carrier layer.
13. The chip card arrangement of claim 11,
wherein the one carrier layer or a number of carrier layers is or are the web or the webs of a chip card.
14. The chip card arrangement of claim 11,
wherein the carrier layer or the carrier layers contain(s) plastics material.
15. The chip card arrangement of claim 11,
wherein the connecting material is an adhesive.
16. The chip card arrangement of claim 11,
wherein at least one region of the chip card module arrangement is free from the connecting material.
17. A chip card module arrangement, comprising:
a substrate comprising a first surface and a second surface, which are opposite from one another;
a chip receptacle for one or more semiconductor chips on the first surface and/or the second surface;
an antenna arrangement disposed directly on at least an opposite surface of the substrate from the chip receptacle, and
a connecting material receiving area on at least the same surface as the antenna arrangement, the connecting material receiving area configured to receive a connecting material and only taking up a portion of the respective surface, wherein the connecting material receiving area is disjoint from the chip receptacle, wherein the connecting material comprises an adhesive disposed on at least the same surface as that having the antenna arrangement, wherein the connecting material is configured to directly couple the antenna arrangement to at least one carrier layer.
18. A chip card module arrangement, comprising:
a substrate comprising a first surface and a second surface, which are opposite from one another;
a chip receptacle for one or more semiconductor chips on the first surface and/or the second surface;
an antenna arrangement on the first surface and/or the second surface; and
a connecting material receiving area on the first surface and/or the second surface, the connecting material receiving area configured to receive a connecting material and only taking up a portion of the respective surface, wherein the connecting material receiving area is disjoint from the chip receptacle, and wherein the connecting material comprises an adhesive disposed on at least one of the two surfaces where the adhesive is configured to directly couple at least the antenna arrangement to at least one carrier layer; and
wherein the antenna arrangement is disposed directly on a surface opposite to the chip receptacle.

* * * * *